United States Patent
Runas

[11] Patent Number: 5,906,003
[45] Date of Patent: *May 18, 1999

[54] MEMORY DEVICE WITH AN EXTERNALLY SELECTABLE-WIDTH I/O PORT AND SYSTEMS AND METHODS USING THE SAME

[75] Inventor: Michael E. Runas, McKinney, Tex.

[73] Assignee: Cirrus Logic, Inc., Fremont, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/633,574

[22] Filed: Apr. 17, 1996

[51] Int. Cl.$^6$ ........................................ G06F 12/04
[52] U.S. Cl. ............................. 711/218; 711/201
[58] Field of Search ................. 395/405, 421.07, 395/421.08, 421.09; 365/238.5, 230.08, 230.09; 711/5, 217, 218, 219, 220, 201

[56] References Cited

U.S. PATENT DOCUMENTS

| | | | |
|---|---|---|---|
| 4,985,872 | 1/1991 | Halbert, III | 365/230.09 |
| 5,265,218 | 11/1993 | Testa et al. | 395/325 |
| 5,319,755 | 6/1994 | Farmwald et al. | |
| 5,408,129 | 4/1995 | Farmwald et al. | |
| 5,430,676 | 7/1995 | Ware et al. | |
| 5,434,817 | 7/1995 | Ware et al. | |
| 5,581,513 | 12/1996 | Rao | 365/238.5 |
| 5,604,714 | 2/1997 | Manning et al. | 365/230.08 |
| 5,703,831 | 12/1997 | Sawada | 365/233 |
| 5,715,476 | 2/1998 | Kundu et al. | 395/855 |

*Primary Examiner*—Eddie P. Chan
*Assistant Examiner*—Kevin Verbrugge
*Attorney, Agent, or Firm*—James J. Murphy; Steven A. Shaw

[57] ABSTRACT

A memory device for storing variable width data words. The memory device (200) comprises an array (201) of memory cells, an address latch (207) for receiving and latching a first address word from an external source, address decoding circuitry (202, 204) for accessing a selected storage location in the array (201) corresponding to the first address word stored in the address latch (207), and mode decode circuitry (220) operable in response to a received code to selectively modify the first address word stored in the address latch (207) to generate a second address word corresponding to a second selected storage location in the array (201).

23 Claims, 5 Drawing Sheets

MEMORY DEVICE WITH AN EXTERNALLY SELECTABLE-WIDTH I/O PORT AND SYSTEMS AND METHODS USING THE SAME

TECHNICAL FIELD OF THE INVENTION

The present invention relates in general to electronic circuits and systems and, in particular, to a variable I/O width memory device and systems and methods using the same.

BACKGROUND OF THE INVENTION

A critical performance feature in any data processing system is the speed at which the CPU can complete an access (read operation or write operation) to electronic memory. The faster data is transferred between the CPU and memory, the better the performance of the processing system. One way data can be transferred more rapidly between the CPU and memory is by increasing the width of the data bus portion of the CPU local bus from, for example, 16 bits to 32 bits, 64 bits or 72 bits. In this way, data words of different sizes up to the maximum size data word for the system can be transferred across the data bus in a single operation.

However, expanding the size of the data bus requires the addition of more memory chips and increases the amount of board space required. Thus, the overall size, complexity and cost of the system are increased. As a result, it is currently preferable to read/write large data words that exceed the data bus width in sequential steps rather than to tailor the width of the data bus to the largest expected data word. For example, in a processing system having a 16 bit data bus, 16-bit words are stored or retrieved in a single memory access cycle for ordinary processor instructions. However, during double-precision instruction operations, a 32-bit word is stored or retrieved from memory in two memory access cycles.

One widely used electronic memory device is the dynamic random access memory (DRAM). Conventional electronic memories, including DRAMs, are of fixed I/O width. These devices store data in an array of N by M bits of storage, where N is the number of rows and M is the number of columns in the array. A K-bit location in memory is accessed using a row address, which accesses one row (containing M bits) out of N possible rows, and a column address, which accesses K columns (containing 1 bit each) out of the M columns (bits) in the accessed row. Row and column addresses are usually multiplexed through a single address port in two portions in order to minimize the number of pins required for interfacing with the address bus.

For example, a 256K×16 bit DRAM is a 4 megabit DRAM configured to allow access through a 16-pin data bus to a 16-bit location during each random access (one row and one column address). The 256K 16-bit data words require an 18-bit address in order to be separately addressable. Typically, a 9-pin address port is used. During a typical DRAM read or write operation, nine row address bits are first sent to the DRAM address port and latched in with a row address strobe (RAS). Nine column address bits are next sent to the DRAM address lines and latched in with a column address strobe (CAS).

Row address bits $A_0$–$A_8$, are sent to a row decoder which accesses one of 512 rows. Each row contains 8192 columns (i.e., 512×16 columns) and each column contains one storage cell (bit). Column address bits $A_9$–$A_{17}$ are sent to a column decoder which accesses one of 512 16-bit storage locations (words) within the accessed row, each storage location corresponding to a group of 16 columns. Depending on whether a read or write operation is being performed, 16 bits of data are either read from or written into the 16 storage cells accessed by the row and column address bits.

In the case where a 32-bit data word is being stored or retrieved, a second sequential column address must also be sent to the DRAM and latched in with a second CAS signal. A second 16 bits of data are then stored or retrieved. If the last column in the accessed row had been reached after the first CAS signal, a new row address and RAS signal would also have to be provided. The substantial drawback to this memory access scheme is that multiple memory addresses are required for data words that are larger than the data I/O width of the electronic memory. This necessarily requires the processor to maintain extra address "overhead" in order to access the larger data words stored in system memory and to prevent the second half of the larger words from being accidently overwritten.

There is therefore a need for improved memory circuits and processing systems using the improved memory circuits that can more easily access large data words in system memory. In particular, there is a need for processing systems and memory devices that can more easily access large data words in system memory by configuring the data I/O width of the memory devices "on the fly."

SUMMARY OF THE INVENTION

The principles of the present invention are embodied in a memory device comprising an array of memory cells, an address latch for receiving and latching a first address word from an external source, and address decoding circuitry for accessing a selected storage location in the array corresponding to the first address word stored in the address latch. The memory device also comprises mode decode circuitry operable in response to a received code to selectively modify the first address word stored in the address latch to generate a second address word corresponding to a second selected storage location in the array.

In a second embodiment of the present invention, a memory device is provided comprising an array of rows and columns of memory cells and an address latch including a row address latch for latching a row address in response to a transition of a received row address strobe and a column address latch for latching a column address in response to a first transition of a received column address strobe. The memory device further comprises a row decoder for selecting a row in the array in response to a latching of the row address in the address latch and a column decoder for accessing first selected ones of the memory cells in the selected row in response to a latching of the column address in the address latch. The memory device also comprises mode decode circuitry operable in response to a received code to modify at least one selected bit of at least a selected one of the row and column addresses latched in the address latch to thereby generate a second address, the second address presented to at least one of the row and column decoders for accessing second selected ones of the memory cells in the array.

In another embodiment of the invention, a data processing system is provided for storing and retrieving variable width data words, the data processing system comprising a processor coupled to an address bus and a data bus, wherein the processor comprises circuitry for generating row and column addresses, circuitry for generating row and column address strobes, and coding circuitry for determining a data width of a selected data word to be accessed by a program instruction being executed by the processor and generating an operation code corresponding to the data width. The data processing system also comprises a memory coupled to the address bus and the data bus and receiving the row and column addresses and the row and column address strobes, wherein the memory comprises an array of rows and columns of memory cells and an address latch including a row address latch for latching a row address in response to a transition of a received row address strobe and a column address latch for latching a column address received in response to a first transition of a received column address strobe. The memory further comprises a row decoder for selecting a row in the array in response to a latching of the row address in the address latch, a column decoder for accessing first selected ones of the memory cells in the selected row in response to a latching of the column address in the address latch, and mode decode circuitry for receiving the operation code from the processor and modifying at least one selected bit of at least a selected one of the row and column addresses latched in the address latch to thereby generate a second address, the second address presented to at least one of the row and column decoders for accessing second selected ones of the memory cells in the array.

In still another embodiment of the present invention, a method is provided for accessing data words in a memory device comprising an array of rows and columns of memory cells. The method including the steps of storing a received row address and a received column address corresponding to a first memory location. The method also includes the steps of: selecting a row in the memory array in response to the row address; accessing first selected ones of the memory cells in the selected row in response to the column address; modifying at least one selected bit of at least a selected one of the row and column addresses stored in the address latch in response to the receipt of an operation code indicating a width of a data word; and accessing second selected ones of the memory cells in the array in response to the a second column address strobe signal.

The foregoing has outlined rather broadly the features and technical advantages of the present invention in order that the detailed description of the memory device that follows may be better understood. Additional features and advantages of the memory device will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts. While memory devices embodying the principles of the present invention are useful in a wide number of applications, for purposes of illustration, such memory devices will be described in conjunction with a basic processing system architecture typically employed in personal computers.

Figure 1:
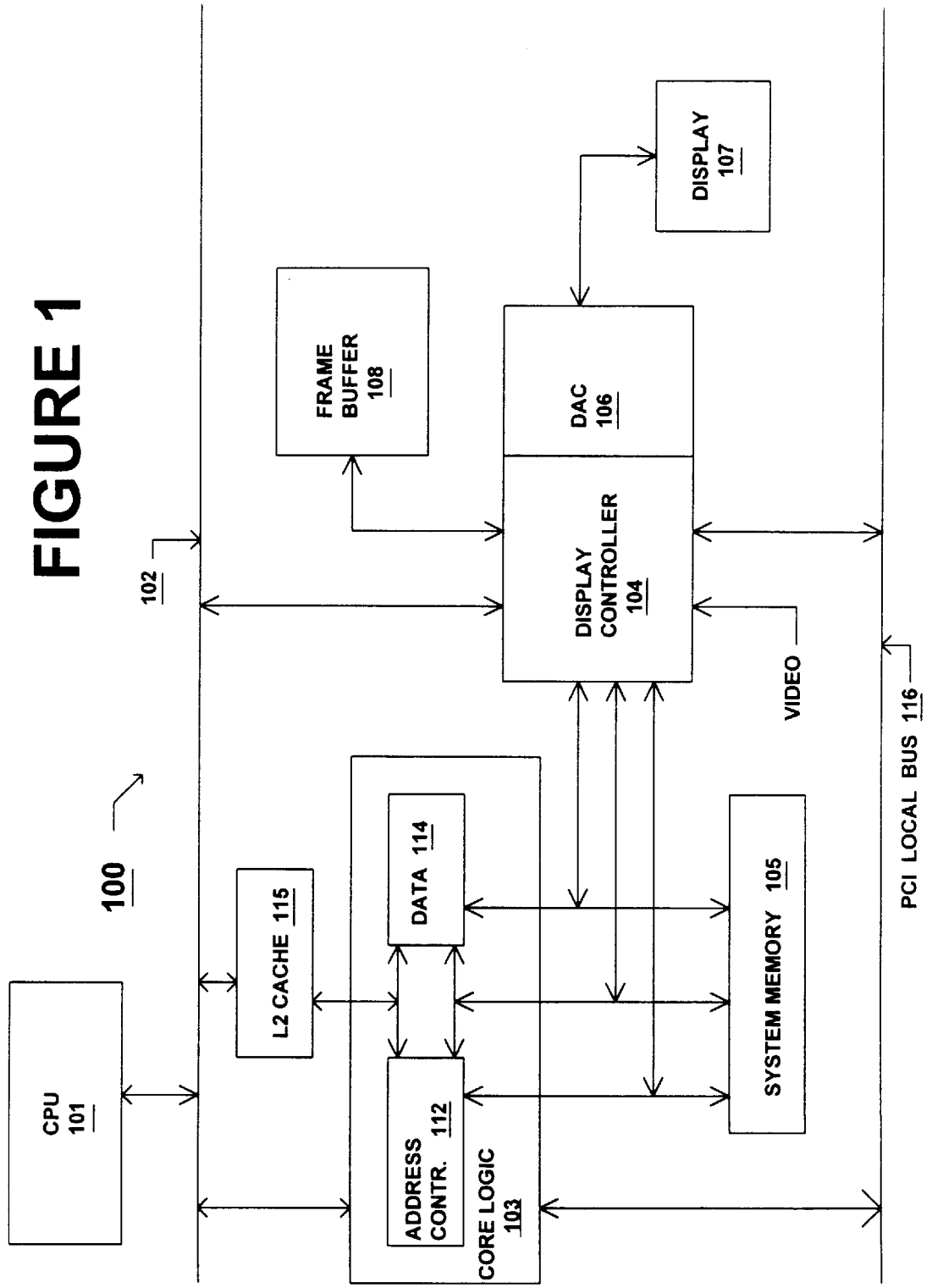
FIG. 1 is a functional block diagram of a processing system comprising at least one memory device which embodies the principles of the present invention.

FIG. 1 is a high level functional block diagram of the portion of a processing system 100. System 100 includes a central processing unit (CPU) 101, a CPU local bus 102, core logic 103, a display controller 104, a system memory 105, a digital-to-analog converter (DAC) 106, frame buffer 108 and a display device 107.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be, for example, a general purpose microprocessor, such as an Intel Pentium class microprocessor or the like, used in commercial personal computers. CPU 101 communicates with the remainder of system 100 via CPU local bus 102, which may be, for example, a special bus, or a general bus (common in the industry).

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system and, in particular, with CPU 101. One or more core logic chips, such as chip 112 in the illustrated system, are typically "address intensive," while one or more core logic chips, such as chip 114 in FIG. 1, are "data intensive." Address intensive core logic chip 112 generally: interfaces CPU 101 with the address path of CPU bus 102; maintains cache memory, including the cache tags, set associative cache tags and other data necessary to insure cache coherency; performs cache "bus snooping"; generates the control signals required for DRAMs in the system memory or cache; and controls general management transactions. Data intensive chip 114 generally: interfaces CPU 101 with the data path of CPU bus 102; issues cycle completion responses to address chip 112 or CPU 101; arbitrates for the data path of bus 102; and, when necessary, aborts operations if their cycles are incomplete.

CPU 101 can directly communicate with core logic 103 or through an external (L2) cache 115. L2 cache 115 may be, for example, a 256 kilobyte fast SRAM device(s). It should be noted that CPU 101 can also include on-board (L1) cache, typically up to 16 kilobytes.

Display controller 104 may be any one of a number of commercially available VGA display controllers. Display controller 104 may receive data, instructions and/or addresses from CPU 101, either through core logic 103 or directly from CPU 101 via CPU local bus 102. Data, instructions, and addresses are exchanged between display controller 104 and system memory 105 through core logic 103. Furthermore, addresses and instructions may be exchanged between core logic 103 and display controller 104 via a local bus which may be, for example, a PCI local bus. Generally, display controller 104 controls screen refresh, executes a limited number of graphics functions, such as line draw, polygon fill, color space conversion, display data interpolation and zooming, and video streaming, and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data to drive display 107 in response. In the illustrated embodiment, DAC 106 is integrated with display controller 104 onto a single chip. Depending on the specific implementation of system 100, DAC 106 may also include a color palette, YUV-to-RGB format conversion circuitry, and/or X- and Y-zooming circuitry, to name a few options. Display 107 may be, for example, a CRT unit, a liquid crystal display, electroluminescent display, plasma display, or any other type of display device which displays images on a screen as a plurality of pixels. It should also be noted that in alternate embodiments, "display" 107 may be another type of output device, such as a laser printer or similar document view/print appliance.

The data paths in system 100 will vary with each design. For example, system 100 may be a "64-bit" or "72-bit" system. Assume for discussion purposes that a 64-bit system is chosen. Then, each of the data connections, including the data paths of CPU bus 102 and PCI bus 116, the data paths through core logic 103 to system memory 109 and display controller 104, and the data interconnection between display controller 104 and frame buffer 108, are all 64 bits wide. This would require that four 16-bit DRAM devices be used in parallel. A double-precision word in such a system would contain 128 bits. It should be noted that the address interconnections will vary depending on the size of the memory and such factors as the need to support data byte select and virtual memory operations. In a Pentium processor system, the address portions of CPU bus 102 and PCI bus 116 are typically on the order of 30 bits wide.

For purposes of brevity and clarity, the following text will discuss a DRAM device embodying a variable I/O width data port in accordance with the principles of the present invention. Additionally, the variable I/O width DRAM device described will be assumed to store narrow data words ("single words") that contain 16 bits, or wide data words ("double words") that contain 32 bits. However, it will be readily understood by one skilled in the art that the DRAM device and data word widths hereafter described are illustrative only and that the teachings of the present invention may readily be applied to other types of electronic memories, such as static RAMs (SRAMs), and devices using other data word widths without departing from the spirit and scope of the claimed invention.

Figure 2:
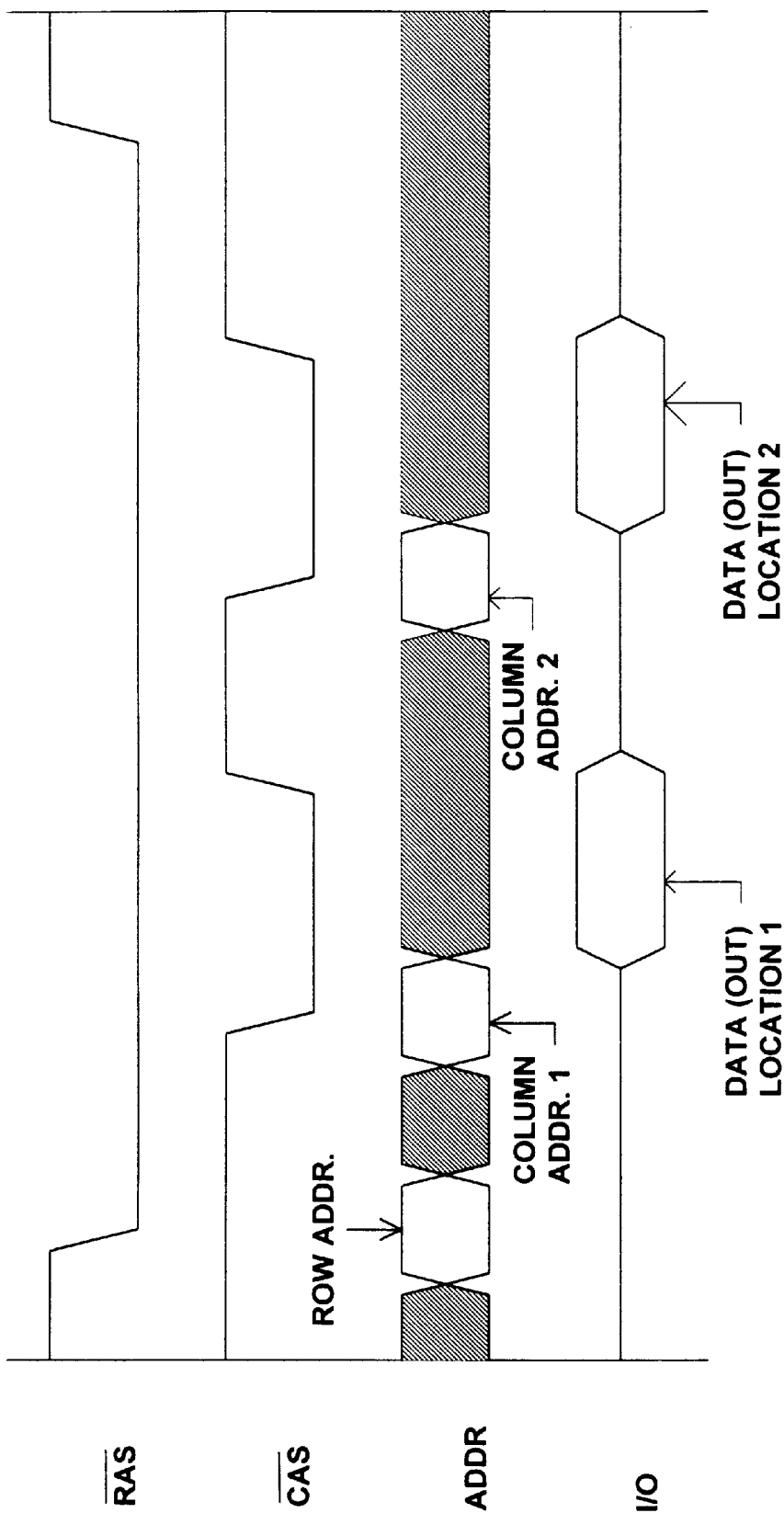
FIG. 2 is a timing diagram depicting an exemplary sequence of selected signals during a memory access in accordance with a prior art memory device.

FIG. 2 is a timing diagram depicting the relationship between the address control signals $\overline{RAS}$ and $\overline{CAS}$ in an electronic memory device in accordance with the prior art. FIG. 2 shows a conventional page cycle for a 16 bit wide DRAM in which data is read out of a DRAM from sequential 16-bit locations. The read operation is initiated when the first portion of the memory address, the row address bits, are presented to the address bus of the DRAM. After a brief set-up time to allow the address bits to become stable, the signal $\overline{RAS}$ transitions low to latch in the row address bits.

After the row address has been latched in, the second portion of the memory address, the column address bits, are applied to the address pins of the DRAM. After a brief set-up time to allow the address bits to stabilize, the signal $\overline{CAS}$ transitions low to latch in the column address bits. The combined row address bits and column address bits select 16 columns (columns 0–15) of Location (word) 1 of the selected row. The data bits stored in Location 1 are then sent to the data I/O bus pins of the DRAM. After a suitable set-up time to allow the data bits on the data I/O bus to become stable, the signal $\overline{CAS}$ transitions high and the data I/O bus returns to a high impedance state.

Assuming that the next data word to be read is stored sequentially to Location 1, the column address bits are incremented to select Location 2 (columns 16–31) and the signal $\overline{CAS}$ again transitions low to latch in the new column address bits. The new incremented address may be received from an external source, such as the core logic. Alternatively, column address incrementing may be performed internally by conventional page mode circuitry.

After a delay, the data stored in Location 2 are sent to the data I/O bus pins of the DRAM device. After the data has been read, the signals $\overline{RAS}$ and $\overline{CAS}$ both transition high to complete the read operation. The end result of the foregoing operation is that 32 bits of data are read from two consecutive 16-bit (16-column) locations in the DRAM device. Because the two data words were located in consecutive locations within the same row, only one row address was needed. However, two separate column addresses were required in order to select the two individual data words. If the needed 32 bits had been split between two rows, such as between the last location of one row and the first location of the next row, two row addresses and two RAS cycles would also be required.

Additional 16-bit data words may be read from subsequent columns in the DRAM memory device by continuing to hold $\overline{RAS}$ low while incrementing the column address and continuing to cycle $\overline{CAS}$ low. In such a case, the processor or internal page mode circuitry would have to continue to supply a column address for each 16-bit data word. Also, data words could be read from non-consecutive columns, but a new row address would have to be provided for each such read operation.

Figure 3:
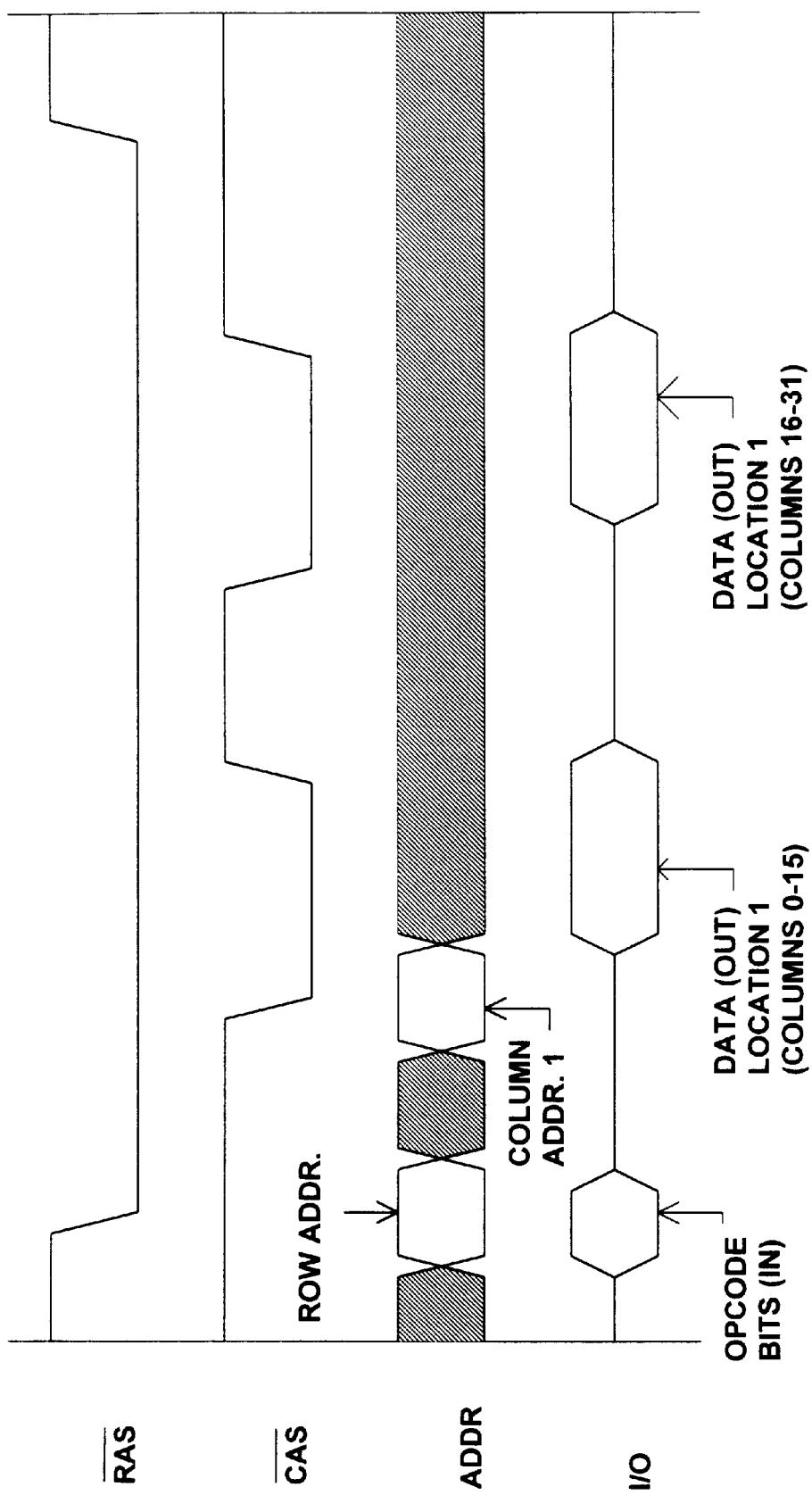
FIG. 3 is a timing diagram depicting an exemplary sequence of selected signals during a memory access in accordance with a memory device embodying the principles of the present invention.

FIG. 3 is a timing diagram depicting the relationship between the address control signals $\overline{RAS}$ and $\overline{CAS}$ during a read operation in an electronic memory device in accordance with the present invention. In the timing diagram shown in FIG. 3, additional bits of a double word (i.e., bits 16–31) are multiplexed in time on the same data pins as bits 0–15 of the same data word, without the need for additional column address bits to select the second portion of the data word.

Assume again for discussion purposes that a read is being performed (the principles of the present invention apply equally to write operations). The read operation is initiated when the first portion of the memory address, the row address bits, are presented to the address bus of the DRAM. At the same time, however, CPU 101 and/or core logic 103 presents selected operation code (hereafter, "opcode") bits related to the size of the data word being accessed to one or more of the data I/O bus pins to the DRAM device. After a brief set-up time to allow the address and opcode bits to become stable, the signal $\overline{\text{RAS}}$ transitions low to latch in the row address bits and the opcode bits.

After the row address bits are latched in, the Location 1 column address bits are sent to the DRAM device and two consecutive $\overline{\text{CAS}}$ active (low) periods are exercised which cause bits 0–15 and bits 16–31 of a 32-bit double word to be read out of the DRAM device. Specifically, the DRAM device decodes the opcode bits sent by CPU 101/core logic 103, determines that a double word is being accessed, and multiplexes two single words onto the 16 data I/O bus pins without requiring a second column address. Opcode bit decoding in the preferred embodiment is discussed below in conjunction with FIG. 4.

Thus, the present invention allows, for example, a double-precision 32-bit data word to be read from a 16 bit data bus without maintaining the address overhead associated with a conventional DRAM device in accordance with the previously-discussed prior art. As noted above, the present invention accomplishes this by examining one or more opcode bits related to the current program instruction to determine if the argument of the instruction being executed by CPU 101 requires a single word (e.g., 16 bits) or a double word, (e.g., 32 bits). Opcode bits are then sent to the DRAM device on the data.I/O bus pins at the same time as the row address.

Figure 4:
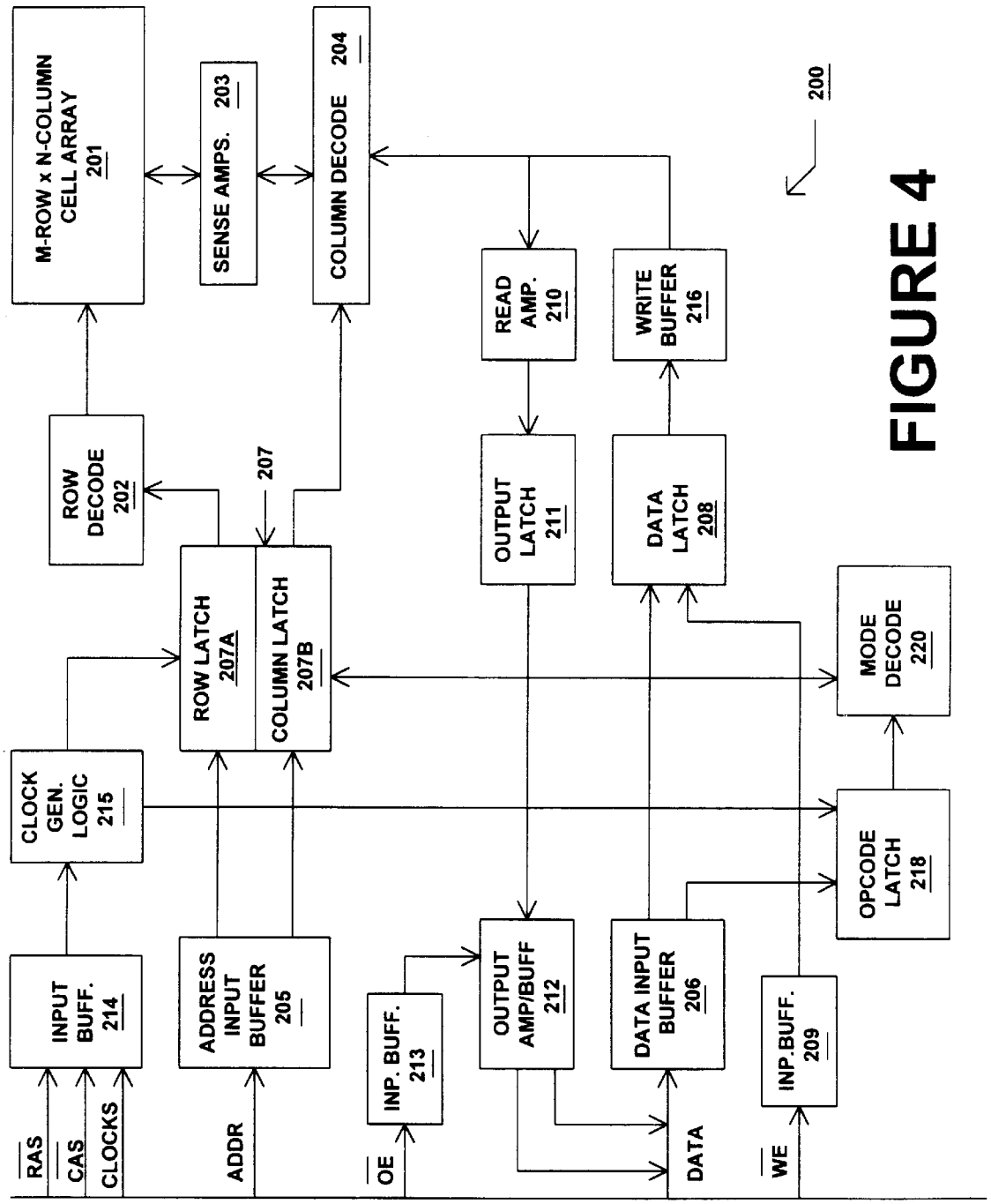
FIG. 4 is a block diagram of a memory device embodying the principles of the present invention.

FIG. 4 is a block diagram of DRAM 200, a memory device in accordance with the present invention that may, in one application, form a part of system memory 105. DRAM 200 receives the Output Enable signal, $\overline{\text{OE}}$, the Write Enable signal $\overline{\text{WE}}$, $\overline{\text{RAS}}$, $\overline{\text{CAS}}$, and address bits and data bits from core logic 103. Additionally, DRAM device 200 receives clock signals and opcode data from CPU 101. In alternate embodiments of the present invention, the clock signals used by DRAM 200 may be internally generated.

Address input buffer 205 receives row address bits and column address bits from core logic 103 under the control of CPU 101. As shown in FIG. 4, row address bits are latched into row latch 207A, the row portion of latch 207, on the falling edge of the signal $\overline{\text{RAS}}$. At the same time, the opcode bits are received from CPU 101 by data input buffer 206 and are latched into opcode latch 218 on the falling edge of the signal $\overline{\text{RAS}}$. The latched opcode bits are sent to mode decode circuit 220. Mode decode circuit 220 and clock generator logic circuit 215 generate the signals necessary to latch into latch 207 the row address and column address bits presented by address input buffer 205.

The row address bits are presented by row latch 207A to row decoder 202, which selects a corresponding row in M-row×N-column cell array 201. Next, the column address bits are received by address input buffer 205. The falling edge of the first $\overline{\text{CAS}}$ signal received then latches the column address bits from address input buffer 205 into column latch 207B. The latched column address bits are presented to column decode circuit 204. The first column address selects a first location of 16-bits within the addressed row of M-row×N-column cell array 201. The data bits in the selected location are sensed and latched by sense amplifiers 203 and gated through column decode circuit 204 to read amplifier 210 and output latch 211. When the signal $\overline{\text{OE}}$ goes low, input buffer 213 causes the data bits stored in output latch 211 to be sent through output amplifier/buffer 212 to the data I/O bus pins of DRAM 200.

In one embodiment of the present invention, when a second falling edge of the signal $\overline{\text{CAS}}$ is received by input buffer 214, the column address bits stored in column latch 207B are modified so that at least one bit is toggled to a different value, thereby causing column decode circuit 204 to address a different location in the addressed row. The new data bits from the second selected location are then sensed and latched by sense amplifiers 203 and presented through column decode circuit 204 to output latch 211. The latched data bits are then sent through output amplifier/buffer 212 to the data I/O bus pins of DRAM 200.

In an alternate embodiment of the present invention, when a second falling edge of the signal $\overline{\text{CAS}}$ is received by input buffer 214, the row address bits stored in row latch 207A are modified so that at least one bit is toggled to a different value, thereby causing row decode circuit 202 to select a different row in cell array 201. This is possible because the opcode bits were latched-in along with the row address bits at the start the read operation. The new data bits from the second addressed row are then sensed and latched by sense amplifiers 203 and sent through column decode circuit 204 to output latch 211. The latched data bits are then sent through output amplifier/buffer 212 to the data I/O bus pins of DRAM 200. In this embodiment, the column address does not change, rather, the second $\overline{\text{CAS}}$ signal causes data bits from the same column position in a different row to be selected.

The foregoing description of the present invention has described exemplary read operations. However, in a similar manner, a 32-bit double word may be stored in cell array 201 in a write operation that requires only one row address and one column address in order to store the double word as two single words in separate 16-bit column address locations.

Figure 5:
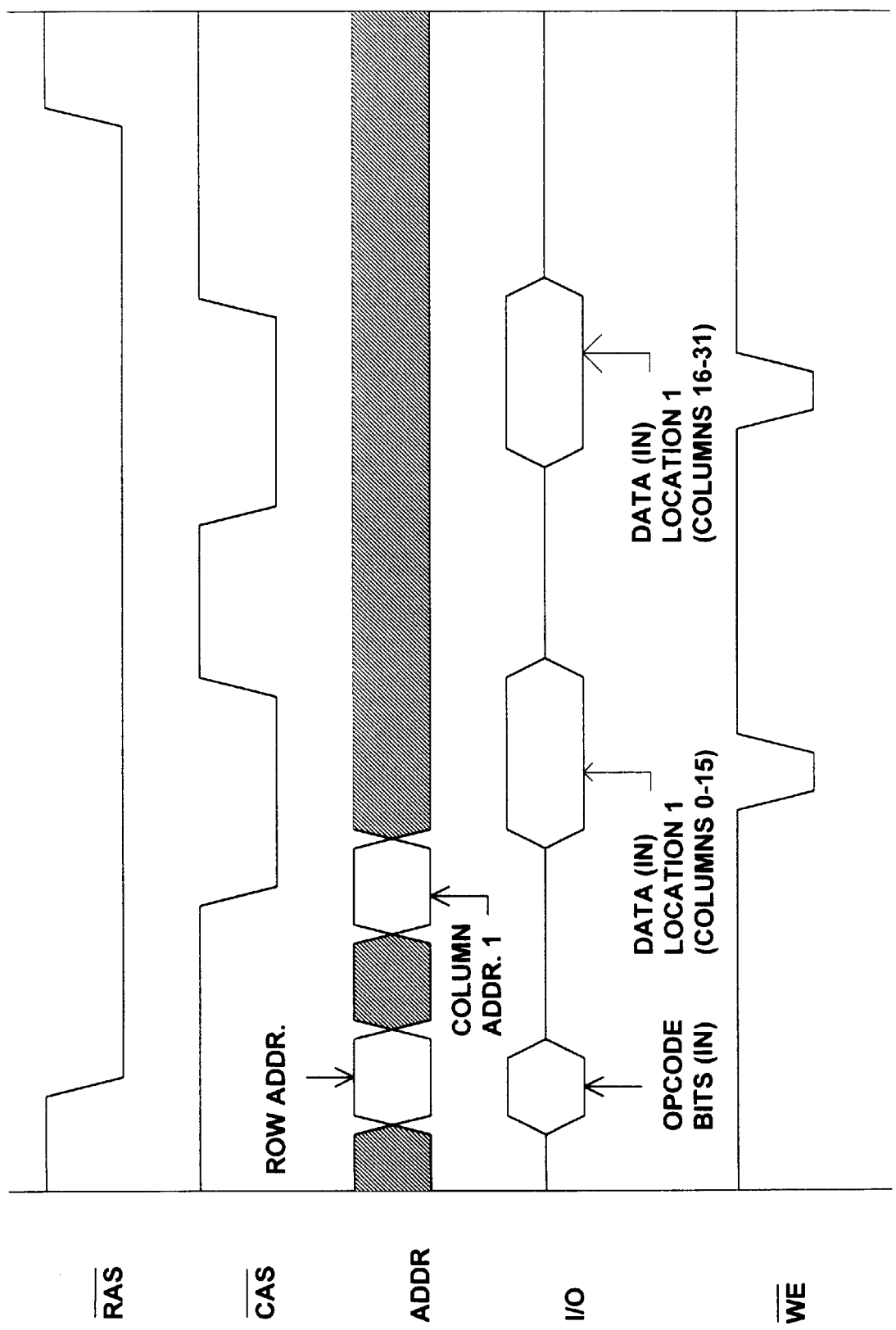
FIG. 5 is a timing diagram depicting an exemplary sequence of selected signals during a memory access in accordance with a memory device embodying the principles of the present invention.

FIG. 5 is a timing diagram depicting the relationship between the address control signals $\overline{\text{RAS}}$ and $\overline{\text{CAS}}$ during a write operation in an electronic memory device in accordance with the present invention. As in a read operation, CPU 101 first provides a row address and opcode bits that are latched in when $\overline{\text{RAS}}$ transitions low. Next, a column address is latched in by a first $\overline{\text{CAS}}$ signal, which selects a first 16-bit location within the addressed row. While $\overline{\text{CAS}}$ is still low, the first 16 data bits are sent through data input buffer 206 and stored in data latch 208 when input buffer 209 senses a low-going edge of the signal $\overline{\text{WE}}$. The 16 latched data bits are then driven by write buffer 216 through sense amplifiers 203 into the first location in cell array 201 selected by column decode circuit 204.

After the signal $\overline{\text{WE}}$ has returned high, a second $\overline{\text{CAS}}$ signal and a second $\overline{\text{WE}}$ signal are then received by DRAM 200 and at least one of the column address bits latched into column latch 207B is toggled so that column decode circuit 204 selects a second column location in the addressed row of cell array 201 for the storage of the second 16 bits in the 32-bit data word.

In an alternate embodiment of the present invention, mode decode circuit 220 causes one of the latched row address bits stored in row latch 207A to toggle in order to select a second row within M-row×N-column cell array 201 for storing the second 16 bits of the 32-bit data word during a write operation. This is possible because the opcode bits were latched in along with the row address bits at the start of the write operation.

When a double word is written to an address, CPU 101 maintains a record of the location of the second 16 bits of the double word in order not to write over the second bits. For example, if the address space of CPU 101 is 24 bits (12 row bits and 12 column bits) and CPU 101 stores a single word at address 000003(Hex), a double word at address location 000004(Hex), and a single word at address location 000005 (Hex), CPU 101 determines where the second 16 bits of the double word at address 000004 are stored and will not store a second data word beginning at that location. Thus, if DRAM 200 toggles the most significant column address bit in order to store the second 16 bits of the double word, the second half of the double word is stored at address 000804 (Hex). If, in an alternate embodiment, DRAM 200 toggles the most significant row address bit in order to store the second 16 bits, the second half of the double word is stored at address 800004(Hex). In either case, CPU 101 will not store a different data word beginning at either address 000804(Hex) or 800004(Hex).

Since the number of opcode bits that CPU 101 sends to DRAM 200 can be as wide as the data I/O bus on which the opcode bits are sent, the opcode bits may correspond to a large number of values and each opcode value may correspond to a different storage scheme within DRAM 200. For example, a first opcode value may cause one or more designated column address bits to toggle when a second $\overline{CAS}$ signal is received. However, a second opcode value may cause a different group of column address bits to toggle when a second $\overline{CAS}$ signal is received. Similarly, other opcode values may cause different groups of one or more row address bits to toggle when a second $\overline{CAS}$ signal is received. Finally, some opcode values may cause different groups of one or more row address bits and one or more column address bits to toggle when a second $\overline{CAS}$ signal is received.

Thus, for example, if CPU 101 saves data in both single precision and double precision word sizes, that data may be stored in the standard address space within system memory 105 without having to modify other addresses to account for different word sizes. CPU 101 may select opcode values that cause the second half of each double word to be stored outside the standard display data address space in a preselected block of memory that is determined by which row and/or column bits are toggled. CPU 101 preferably then avoids storing other data in the predetermined block.

In other embodiments of the present invention, DRAM 200 reads or writes more than one 32-bit double word for each row address and column address received. For example, after DRAM 200 has latched in a row address and a column address, DRAM 200 may store or output a new single width data word from a different column location for each falling edge of the $\overline{CAS}$ signal. Thus, for example, DRAM 200 may output a 48-bit data word in response to three $\overline{CAS}$ signals, or 64-bit data word in response to four $\overline{CAS}$ signals. In such cases, the opcode bits received from CPU 101 determine the locations of the additional data words in DRAM 200.

The foregoing text has described the incorporation of the present invention in an asynchronous DRAM device. It should be understood, however, that in other embodiments of the present invention, DRAM 200 may be a synchronous DRAM that receives a clock signal from an external master clock, as is widely known in the art.

Although the present invention and its advantages have been described in detail, it should be understood that various changes, substitutions and alterations can be made herein without departing from the spirit and scope of the invention as defined by the appended claims.

What is claimed is:

1. A memory device comprising:

an array of memory cells;

an address latch for receiving and latching a first address word from an external source;

address decoding circuitry for accessing a j-bit wide first part of an n-bit word using a selected storage location in said array corresponding to said first address word stored in said address latch; and mode decode circuitry operable in response to a received code indicating a width n of said n-bit word to selectively modify said first address word stored in said address latch in accordance with said code to generate a second address word for accessing an i-bit wide second part of said n-bit word using a second selected storage location in said array, where i, j, and n are positive integers j+i≦n, said mode decode circuitry operable to perform accesses of said first and second words from locations having non-consecutive addresses.

2. The memory device of claim 1 wherein each said address word comprises a row address and a column address and said mode decode circuitry is operable to modify at least one bit of a select one of said row and column addresses.

3. The memory device of claim 2 wherein said mode decode circuitry is operable to modify at least one selected bit of each of said row and column addresses.

4. The memory device of claim 1 wherein each said address word comprises a row address and a column address, said address latch latching said row address in response to a row address strobe transition and latching said column address in response to a first column address strobe transition.

5. The memory device of claim 4 wherein said mode decode circuitry modifies said address word to generate said second address word in response to a second transition of said column address strobe.

6. The memory device of claim 5 wherein said mode decode circuitry is operable to modify said second address word to generate a third address word corresponding to a third selected storage location in said array in response to a third transition of said column address strobe.

7. The memory device of claim 6 wherein said mode decode circuitry is operable to modify said third address word to generate a fourth address word corresponding to a fourth selected storage location in said array in response to a fourth transition of said column address strobe.

8. The memory device of claim 4 wherein said mode decode circuitry is operable to modify at least one bit of a select one of said row and column addresses.

9. The memory device of claim 8 wherein said mode decode circuitry is operable to modify at least one selected bit of each of said row and column addresses.

10. The memory device of claim 1 wherein said memory device is an asynchronous DRAM device.

11. A memory device comprising:

an array of rows and columns of memory cells;

an address latch including a row address latch for latching a row address in response to a transition of a received row address strobe and a column address latch for latching a column address in response to a first transition of a received column address strobe;

a row decoder for selecting a row in said array in response to a latching of said row address in said address latch;

a column decoder for accessing a j-bit portion of an n-bit word from first selected ones of said memory cells in said selected row in response to a latching of said column address in said address latch; and mode decode circuitry operable in response to a received code indicating a size n of said n-bit word to modify at least one selected bit identified by said code of at least a selected one of said row and column addresses latched in said address latch to thereby generate a second address, said second address presented to at least one of said row and column decoders for accessing an i-bit portion of said n-bit word from second selected ones of said memory cells in said array where i, j, and n are positive integers and i+j≦n.

12. The memory device of claim 11 wherein said mode decode circuitry modifies said at least one bit in response to a second transition of said column address strobe.

13. The memory device of claim 11 wherein said mode decode circuitry further modifies at least one selected bit of at least a selected one of said row and column addresses latched in said address latch to thereby generate a third address, said third address presented to at least one of said row and column decoders for accessing third selected ones of said memory cells in said array.

14. The memory device of claim 13 wherein said mode decode circuitry further modifies at least one selected bit of at least a selected one of said row and column addresses latched in said address latch to thereby generate a fourth address, said fourth address presented to at least one of said row and column decoders for accessing fourth selected ones of said memory cells in said array.

15. The memory device of claim 11 wherein said memory device is an asynchronous DRAM device.

16. A data processing system for storing and retrieving variable width data words, said data processing system comprising:

a processor coupled to an address bus and a data bus, said processor comprising:
circuitry for generating row and column addresses;
circuitry for generating row and column address strobes; and
coding circuitry for determining a data width n of a selected n-bit data word to be accessed by a program instruction being executed by said processor and generating an operation code corresponding to said data width; and a memory coupled to said address bus and said data bus and receiving said row and column addresses and said row and column address strobes, said memory comprising:
an array of rows and columns of memory cells;
an address latch including a row address latch for latching a row address in response to a transition of a received row address strobe and a column address latch for latching a column address received in response to a first transition of a received column address strobe;
a row decoder for selecting a row in said array in response to a latching of said row address in said address latch;
a column decoder for accessing a j-bit portion of said n-bit word from first selected ones of said memory cells in said selected row in response to a latching of said column address in said address latch; and
mode decode circuitry for receiving said operation code from said processor and modifying at least one selected bit identified by said code of at least a selected one of said row and column addresses latched in said address latch to thereby generate a second address, said second address presented to at least one of said row and column decoders for accessing an i-bit portion of said n-bit wide word from second selected ones of said memory cells in said array, said mode decode circuitry operable to selectively split said first and second parts of said word between two rows in said array.

17. The data processing system of claim 16 wherein said mode decode circuitry modifies said at least one bit in response to a second transition of said column address strobe.

18. The data processing system set forth in claim 16 wherein said processor transmits said operation code to said memory on said data bus substantially simultaneously with transmission of said row address to said memory.

19. The data processing system set forth in claim 16 wherein said memory is an asynchronous DRAM device.

20. A method of accessing data words in a memory device comprising an array of rows and columns of memory cells, the method comprising the steps of:

storing a received row address corresponding to a first memory location in the memory device;
storing a received column address corresponding to the first memory location;
selecting a row in the memory array in response to the row address;
accessing first selected ones of the memory cells in the selected row in response to the column address to access j number of first bits of an n-bit wide data word;
modifying at least one selected bit in accordance with a scheme defined by said code of at least a selected one of the row and column addresses stored in the address latch in response to the receipt of an operation code indicating a width n of the n-bit data word; and
accessing second selected ones of the memory cells in the array in response to the modified address to access i number of second bits of the n-bit wide word.

21. The method set forth in claim 20 wherein the first selected ones of the memory cells and the second selected ones of the memory cells are in different columns of the memory device.

22. The method set forth in claim 20 wherein the first selected ones of the memory cells and the second selected ones of the memory cells are in different rows of the memory device.

23. The method set forth in claim 20 wherein the first selected ones of the memory cells and the second selected ones of the memory cells are in different columns and different rows of the memory device.

* * * * *